United States Patent
Takiguchi et al.

[11] Patent Number: 5,221,898
[45] Date of Patent: Jun. 22, 1993

[54] FLOW IMAGING METHOD USING AN MRI APPARATUS

[75] Inventors: Kenji Takiguchi, Kodaira; Hidemi Shiono, Akigawa; Etsuji Yamamoto, Akishima; Ryuichi Suzuki, Kokubunji, all of Japan

[73] Assignee: Hitachi, Ltd., Chiyoda, Japan

[21] Appl. No.: 798,907

[22] Filed: Nov. 27, 1991

[30] Foreign Application Priority Data

Nov. 30, 1990 [JP] Japan .................... 2-337077
Mar. 5, 1991 [JP] Japan .................... 3-064085
Jun. 21, 1991 [JP] Japan .................... 3-149114

[51] Int. Cl.⁵ .................................. G01R 33/20
[52] U.S. Cl. .................................. 324/306; 324/309
[58] Field of Search ............ 324/300, 307, 306, 309, 324/318; 128/653.2, 653.5

[56] References Cited

U.S. PATENT DOCUMENTS

| | | | |
|---|---|---|---|
| 4,714,081 | 12/1987 | Dumoulin et al. | 128/653 |
| 4,796,635 | 1/1989 | Dumoulin | 128/653 |
| 4,800,889 | 1/1989 | Dumoulin et al. | 128/653 |
| 4,849,697 | 7/1989 | Cline et al. | 324/306 |
| 4,912,412 | 3/1990 | Suzuki et al. | 324/312 |
| 5,022,397 | 6/1991 | Dumoulin | 128/653 |
| 5,022,398 | 6/1991 | Dumoulin | 128/653 |
| 5,025,788 | 6/1991 | Dumoulin | 128/653 |
| 5,038,783 | 8/1991 | Dumoulin | 128/653 |
| 5,038,784 | 8/1991 | Dumoulin | 128/653 |

OTHER PUBLICATIONS

Radiology, vol. 161, pp. 527-531, 1986.
Magnetic Resonance in Medicine, vol. 12, pp. 1-13, 1989.

Primary Examiner—Michael J. Tokar
Attorney, Agent, or Firm—Antonelli, Terry, Stout & Kraus

[57] ABSTRACT

This invention relates to a ultra-high speed nuclear magnetic resonance fluid imaging method for selectively reconstructing projected images of a fluid from an echo train generated by the use of a readout gradient magnetic field which inverses periodically. A pulse-like encoding gradient magnetic field is used in combination with a readout gradient magnetic field which inverses periodically, so as to generate an echo train containing alternately echoes whose phase change of magnetization due to a flow is emphasized and echoes whose phase change of magnetization due to the flow is corrected, and subjected sequentially to phase encoding. A data train containing only the echoes whose phase change of magnetization due to the flow is emphasized and a data train containing only the echoes whose phase change of magnetization due to the flow is corrected are formed from sampling data of these echoes, respectively, and two images are then obtained by subjecting them individually to two-dimensional Fourier transform. Both of these images are then subtracted.

16 Claims, 9 Drawing Sheets

FIG. 3
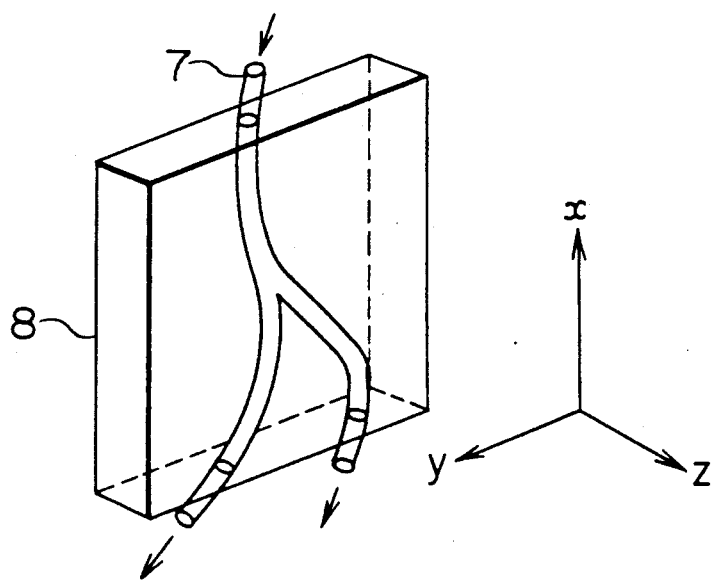
FIG. 4  FIG. 5  FIG. 6
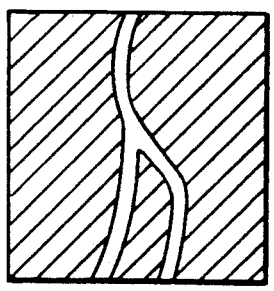 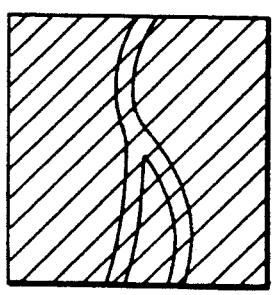 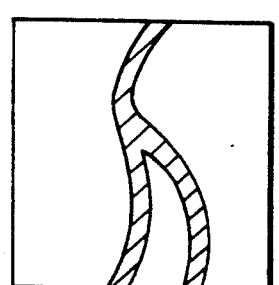

FLOW IMAGING METHOD USING AN MRI APPARATUS

BACKGROUND OF THE INVENTION

This invention relates generally to a fluid imaging method and more particularly, to MR angiography or in other words, a method of obtaining a blood flow image inside a human body by utilizing nuclear magnetic resonance.

A typical specific example of conventional blood flow imaging methods using an MRI apparatus is the one that extracts only a blood flow by subtraction of an image obtained by a flow-sensitive pulse sequence and an image obtained by a flow-insensitive pulse sequence. As typified by this method, those methods which obtain an intended image from a plurality of images having mutually different properties are generally known. One of such methods is discussed in "Magnetic Resonance In Medicine", Vol. 12, pp. 1-13, 1989. This method obtains the blood flow image by subtraction of the images obtained by two measurements in the case where magnetic field waveforms of a readout gradient magnetic field are represented by flow encode pulses wherein the phase change of magnetization due to a flow is emphasized, and in the case where they are represented by flow compensate pulses wherein the phase change of magnetization due to the flow is corrected.

On the other hand, a half encode method is known as the method of reducing by half the data sampling number without reducing resolution. This method measures only the half of a Fourier space and obtains the rest of the data by calculation by utilizing the fact that measurement data have mutually conjugate complex relation on the Fourier space if the image data are the real number. This method is described in detail in "Radiology", Vol. 161, pp. 527-531, 1986, for example.

SUMMARY OF THE INVENTION

According to the prior art techniques described above, the waveforms of the readout gradient magnetic fields are mutually different in the flow-sensitive pulse sequence and in the flow-insensitive pulse sequence. For this reason, the measurement in each pulse sequence must be sequentially carried out. Further, to obtain a two-dimensional image, a series of sequences of excitation of magnetization, application of a gradient magnetic field, and signal measurement, must be carried out repeatedly. Therefore, a measurement time is long and problems are left yet to be solved in order to obtain a blood flow image of moving regions such as the heart.

It is therefore a fundamental object of the present invention to drastically reduce a measurement time and to make it possible to obtain a clear blood flow image even of a moving region.

It is another object of the present invention to provide a fluid imaging method capable of obtaining a blood flow image having sufficient resolution.

It is still another object of the present invention to provide a fluid imaging method which suppresses the occurrence of artifacts resulting from transverse relaxation of magnetization.

It is a further object of the present invention to provide a fluid imaging method which appropriately diverts a half encode method.

The fundamental characterizing feature of the fluid imaging method of the present invention resides in that echo signals whose phase change of magnetization due to a flow is emphasized and echo signals whose phase change of magnetization due to a flow is corrected are alternately generated by selectively exciting magnetization of a region of interest in which the fluid flows, applying a readout gradient magnetic field whose polarity inverses periodically in a projecting direction and in a vertical direction, and applying an encoding gradient magnetic field in a direction vertical to both of the projecting direction and the readout direction. In other words, the present invention is based on the concept that the magnetic field waveform of the readout gradient magnetic field whose polarity inverses periodically and which is used in an echo planar method as a typical ultra-high speed imaging method is the waveform formed by the alternate combination of flow encode pulses and flow compensate pulses. All the echo signals that appear after the inversion of the odd-numbered gradient magnetic field are the echo signals whose phase change of magnetization due to a flow is emphasized while all the echo signals that appear after the inversion of the even-numbered gradient magnetic field are the echo signals whose phase change of magnetization due to the flow is corrected. Moreover, since position informations can be provided to these echo trains by the encoding gradient magnetic field, a fluid image can be reconstructed from these echo trains.

One of the definite methods of obtaining a fluid image comprises the steps of measuring an echo train while generating phase encoding pulses which change the phase encoding amount in each cycle of a readout gradient magnetic field whose polarity inverses, or in other words, whenever two echoes are generated, reconstructing a first image from a first echo signal train selecting those echoes which occur in the former half of each cycle of the gradient magnetic field waveforms among the echo train thus measured, reconstructing a second image from a second echo signal train selecting those echoes which occur in the latter half of each cycle, and executing subtraction processing between the first and second images. This method can theoretically obtain one fluid image from an echo train successive to one excitation. When compared with the conventional methods wherein excitation of magnetization is repeated a plurality of times, therefore, this method can eliminate a waste time for awaiting the recovery of longitudinal relaxation and can remarkably shorten the measurement time.

Another method of obtaining a fluid image applies a readout gradient magnetic field whose polarity inverses in succession to the first selective excitation, generates phase encoding pulses which change the phase encoding amount whenever the polarity of the waveform of this readout gradient magnetic field inverses, and measures the resulting first echo train. Next, the method applies a readout gradient magnetic field whose polarity inverses in succession to the second selective excitation, generates phase encoding pulses which change the phase encoding amounts whenever the polarity of the waveform of this readout gradient magnetic field inverses, and measures the resulting second echo train. Next, the method selects those echo signals whose phase change of magnetization due to a flow is emphasized from the measurement signals of both the first and second echo trains to obtain a first two-dimensional data array, and reconstructs the first image from this first two-dimensional data array. Similarly, the method selects those echo signals whose phase change of magnetization due to the flow is corrected from the measurement signals of both the first and second echo trains to obtain a second two-dimensional data array, and reconstructs the second image from this second two-dimensional data array. Finally, the method executes subtraction processing between these first and second images and obtains the intended fluid image.

According to the latter method, the measurement time becomes longer than in the former method which obtains the two images from the echo train successive to one excitation of magnetization and then executes subtraction processing. However, since the influences of the inhomogeneity of the static magnetic field or the transverse relaxation gradually accumulate after one excitation of magnetization, the number of echoes that can be measured is limited. In other words, there is the limit to the number of data in the phase encoding direction in the former method and sufficient resolution cannot be easily obtained. According to the latter method, on the other hand, the measurement is dividedly carried out while the echo trains are divided into the first and second echo trains. Therefore, the number of echoes to be measured can be doubled or in other words, the number of data in the phase encoding direction can be doubled, and a blood flow image having sufficient resolution can be obtained. According to either of these methods, the measurement time can be remarkably reduced in comparison with the conventional blood flow imaging methods.

According to the method which effects the measurement by dividing the echo trains into the first and second echo trains, the application of the encode pulses is started at the time of the inversion of the first gradient magnetic field during the measurement of the first echo train, and the application of the encode pulses is started at the time of the inversion of the second gradient magnetic field during the measurement of the second echo train. In other words, the sequence of the appearance of the echo signals whose phase change due to the flow is emphasized and the echo signals whose phase change due to the flow is corrected is inversed between the first and second echo trains. It is particularly preferred that those echoes which have the same phase encode amount between the first and second echo trains be arranged to have the equal time of passage from the excitation of magnetization. To this end, the time difference corresponding to one cycle of the readout gradient magnetic field is provided between the time from the first excitation of magnetization to the start of the generation of the readout gradient magnetic field inversing periodically and the time from the second excitation of magnetization to the start of the generation of the readout gradient magnetic field. If the generation timing of the gradient magnetic field is set in the manner as described above, the influences of the inhomogeneity of the static magnetic field and the transverse relaxation of the magnetization can be made equal between the first and second images, and the occurrence of any artifacts resulting from the subtraction processing can be prevented.

The first and second images described above can be formed by the application of the half encode method. Furthermore, the method described in U.S. Pat. No. 4,912,412 can be applied, as well. This method estimates the phase distribution of the image by the use of measurement data of a partial region near the center of the Fourier space, executes phase correction of the image data in the image space by the use of this phase distribution and thereafter effects inverse transformation of the data so as to correct image degradation resulting from the half encode method. When this improved half encode method is applied to the high speed imaging described above, the measurement data of the partial region near the center are preferably devoid of any influences of the transverse relaxation of magnetization and the inhomogeneity of the static magnetic field. In view of this requirement, too, the present invention proposes the application method of encode pulses which lets the echoes positioned near the center of the Fourier space first appear.

Other features of the present invention will become more apparent from the following description when taken in conjunction with the accompanying drawings.

BRIEF DESCRIPTION OF THE DRAWINGS

FIG. 3 is a schematic view showing the blood vessel as an object of measurement in the embodiment;

FIG. 4 is an explanatory view of an image obtained by image reconstruction from a signal train {S1} in the embodiment;

FIG. 5 is an explanatory view of an image obtained by image reconstruction from a signal train {S2} in the embodiment;

FIG. 6 is a projected view of the image of a blood flow obtained by subtraction of two images in the embodiment;

DESCRIPTION OF THE PREFERRED EMBODIMENTS

Figure 2:
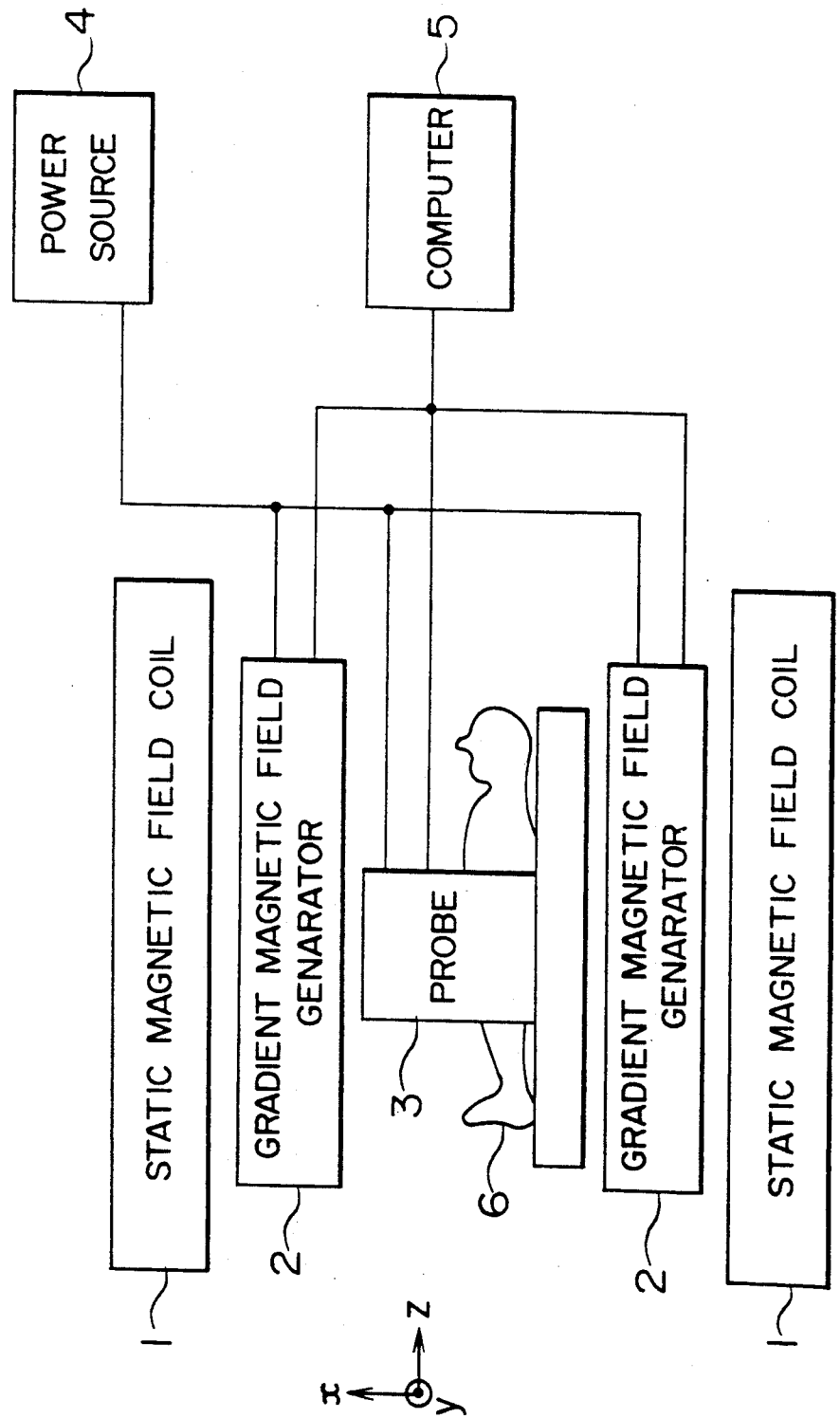
FIG. 2 is a structural view showing the outline of an MRI apparatus used in the embodiment.

FIG. 2 is a block diagram showing the outline of an MRI apparatus to which the fluid imaging method of the present invention is applied. This apparatus comprises a coil 1 for generating a static magnetic field, a gradient magnetic field generator 2 for generating a gradient magnetic field, a probe 3 for transmitting radio frequency pulses and receiving echo signals, a power source 4 for the gradient magnetic field and for the radio frequency pulses, and a computer 5. A subject 6 is inserted into a space to which the static magnetic field described above is applied. The gradient magnetic field generator 2 includes three sets of coils for generating gradient magnetic fields for providing gradients to the intensity of the magnetic fields in the direction of the static magnetic field (z direction) and two other directions orthogonal to the former (x and y directions), respectively. These gradient magnetic fields will be hereinafter referred to as "Gx, Gy and Gz", respectively. The control of these gradient magnetic fields and the control of the radio frequency pulse and signal inputting operations are effected by the computer 5 in accordance with a pulse sequence.

Various embodiments that will appear in this specification deal a region of interest 8 having a certain thickness in the z direction and a certain area in the x and y directions among the subject 6 as shown in FIG. 3 as the object of imaging, and obtain a blood flow image formed by projecting a blood flow inside blood vessels 7 inside the region of interest 8 on the x-y plane.

Next, the fluid imaging operation and procedure in the first embodiment of the present invention will be described.

Figure 1:
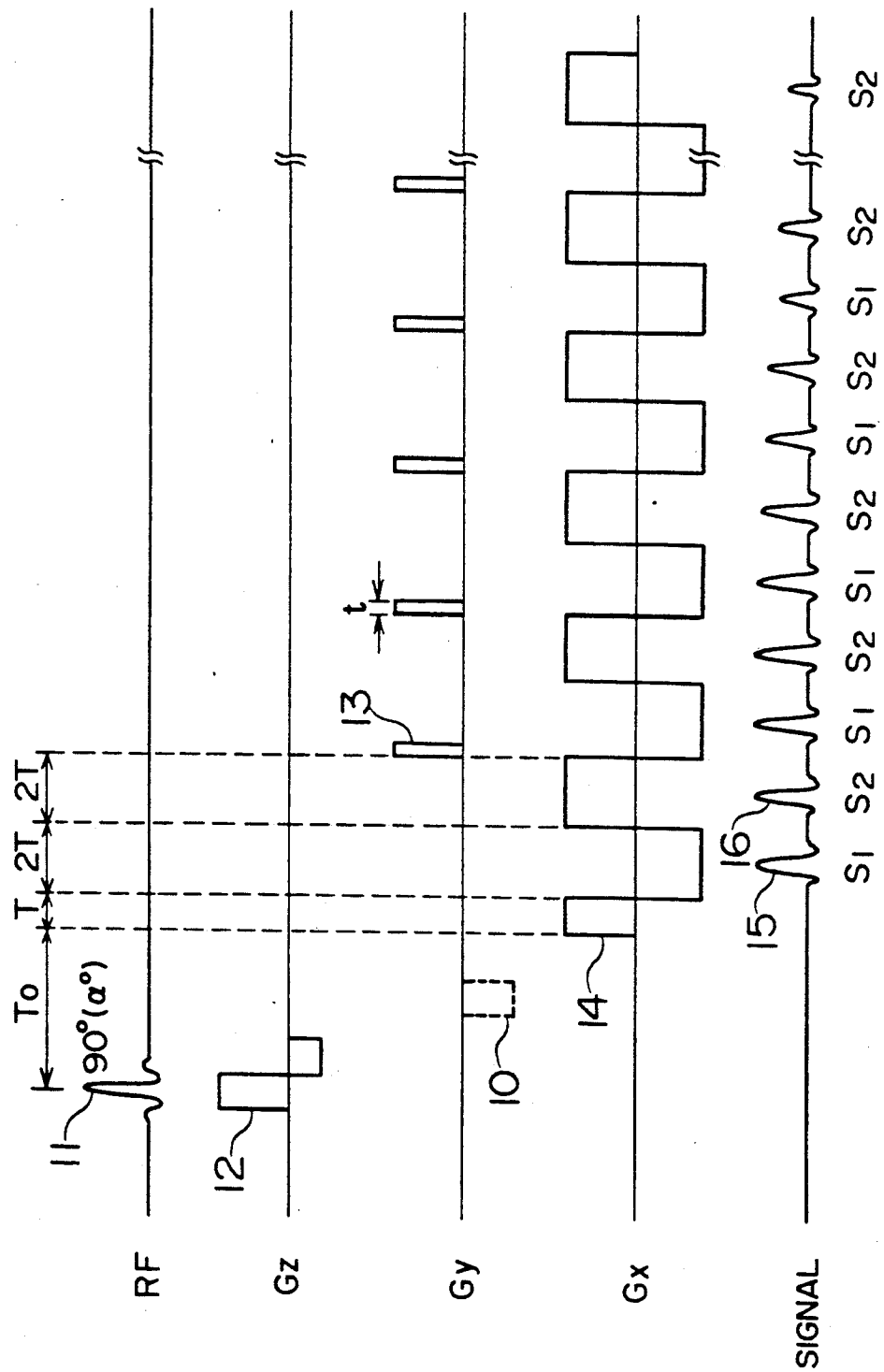
FIG. 1 is a diagram showing an example of a pulse sequence representing a fluid imaging method in a first embodiment of the present invention.

FIG. 1 is a pulse sequence diagram showing the fluid imaging method in the first embodiment of the present invention. To begin with, the gradient magnetic field Gz for grading the magnetic field intensity in the z direction is generated in the pulse form as represented by reference numeral 12, and magnetization of the region of interest is excited by applying a radio frequency pulse 11. Though a 90° pulse is ordinarily used, the radio frequency pulse 11 may as well be a pulse having a smaller flip angle ($\alpha°$). Next, at the time To after the application of the radio frequency pulse 11, the gradient magnetic field Gx for changing the magnetic field intensity in the x direction is generated only for the time T as represented by reference numeral 14. Thereafter, the polarity of Gx, that is, the direction of inclination, is inversed at intervals of the time 2T. Incidentally, Gx is referred to as a "readout gradient magnetic field". At the time (To+4T), the gradient magnetic field Gy for grading the magnetic field intensity in the y direction is applied in the pulse form for the time t which is shorter than the time T, as represented by reference numeral 13. Thereafter, the generation of the pulse of the gradient magnetic field Gy is repeated at intervals of the time 4T or in other words, in each cycle of the waveform of Gx, with the same polarity and the same waveform. Since Gy has the function of providing information of positions in the y direction to the phases of the echo signals, it will be referred to as a "phase encoding gradient magnetic field". In the mean time, the echo signal is generated whenever the sum of the products (G×T) of the gradient of the readout gradient magnetic field and the application time becomes zero (0). There are two kinds of echo signals. The echo signal during the positive period of Gx is represented by S1 and the echo signal during its negative period, by S2. In other words, the phase encoding amount changes for each pair of the echo signals that are sequentially generated.

The phase change $\theta y$ of the echo signals in accordance with such a measurement sequence can be expressed by the following formula 1 where is a gyromagnetic ratio, r is a position, and v is a velocity:

$$\theta y = \gamma \int_0^t Gy(r + vt)dt \tag{1}$$

Let's consider the first set of the echo signals represented by reference numerals 15 and 16 in the diagram in connection with S1 and S2. Then, the phase change at the peak of S1 due to the application of the readout gradient magnetic field can be derived from the formula (1) and expressed by the formula (2) below:

$$\theta X_{s1} = \gamma \int_0^T Gx(r + vt)dt - \\ \gamma \int_T^{2T} Gx(r + vt)dt = -\gamma Gxv(T)^2 \tag{2}$$

This corresponds to the case where the phase change due to the velocity component of the fluid using a flow encode pulse is emphasized. The phase change at the peak of S due to the readout gradient magnetic field can be expressed by the following formula (3):

$$\theta X_{s2} = \gamma \int_0^T Gx(r + vt)dt - \gamma \int_T^{3T} Gx(r + vt)dt + \\ \gamma \int_{3T}^{4T} Gx(r + vt)dt = 0 \tag{3}$$

This corresponds to the case where the phase change due to the velocity component of the fluid is compensated for by the use of a flow compensate pulse. From the formula given above, the phase changes of S1 and S2 are ($\theta y + \theta x_{s1}$) and ($\theta y + \theta x_{s2}$), and the phase difference between S1 and S2 can be expressed by the following formula (4):

$$(\theta y + \theta x_{s1}) - (\theta y + \theta x_{s2}) = \theta x_{s1} - \theta x_{s2} = -\gamma Gxv(T)^2 \tag{4}$$

This phase difference is the quantity which depends on the readout gradient magnetic field, and not only the phase difference between the echo signals S1 and S2 of the first set but also the phase differences between S1 and S2 of subsequent pairs can be given likewise by the formula (4). In other words, when the readout gradient magnetic field shown in FIG. 2 whose polarity periodically inverses is applied, the echo S1 the phase change due to the velocity component of which is emphasized and the echo S2 the phase change due to the velocity component of which is corrected are alternately generated. It can thus be understood that information relating to the flow can be taken out from the measurement signals of these echo trains.

The echo signals S1 and S2 that are alternately generated are sampled, respectively, and are stored as signal trains {S1} and {S2} inside the computer 5. The signal change of the individual echo signals in the direction of the sampling time represent the information of positions along the x direction. Therefore, first and second images are obtained by conducting two-dimensional Fourier transform in the two directions, that is, the direction of the sampling time and the direction of the echo generation sequence, for each data train. Each of the two images thus obtained is the image obtained by projecting the distribution of magnetization of the region of interest, generally the distribution of hydrogen atoms, on the x - y plane. The first image obtained from the signal train {S1} is the image in which the signals are attenuated by the velocity component of the fluid, and the second image obtained from the signal train {S2} is the image in which the influences of the velocity component of the fluid are corrected. Therefore, when the region of interest 8 that the blood vessel 7 transversely crosses as shown in FIG. 3 is selected, the first image becomes such as shown in FIG. 4 and the second image, such as shown in FIG. 5. If subtraction of these images is conducted, the image of the velocity component alone, or in other words, only the blood flow portion, can be obtained as shown in FIG. 6.

Though this embodiment deals with the case of the half encode method, it is obvious that the present invention is also effective for the full encode method. In other words, imaging by the full encode method becomes possible by applying in advance within the period To the pulse 10 of Gy having the gradient-time product, which is the half of the repetition gradient-time product of the pulse 13 of the encoding gradient magnetic field Gy shown in FIG. 1 and in the opposite direction to the pulse 13, as represented by dotted lines.

Figure 7:
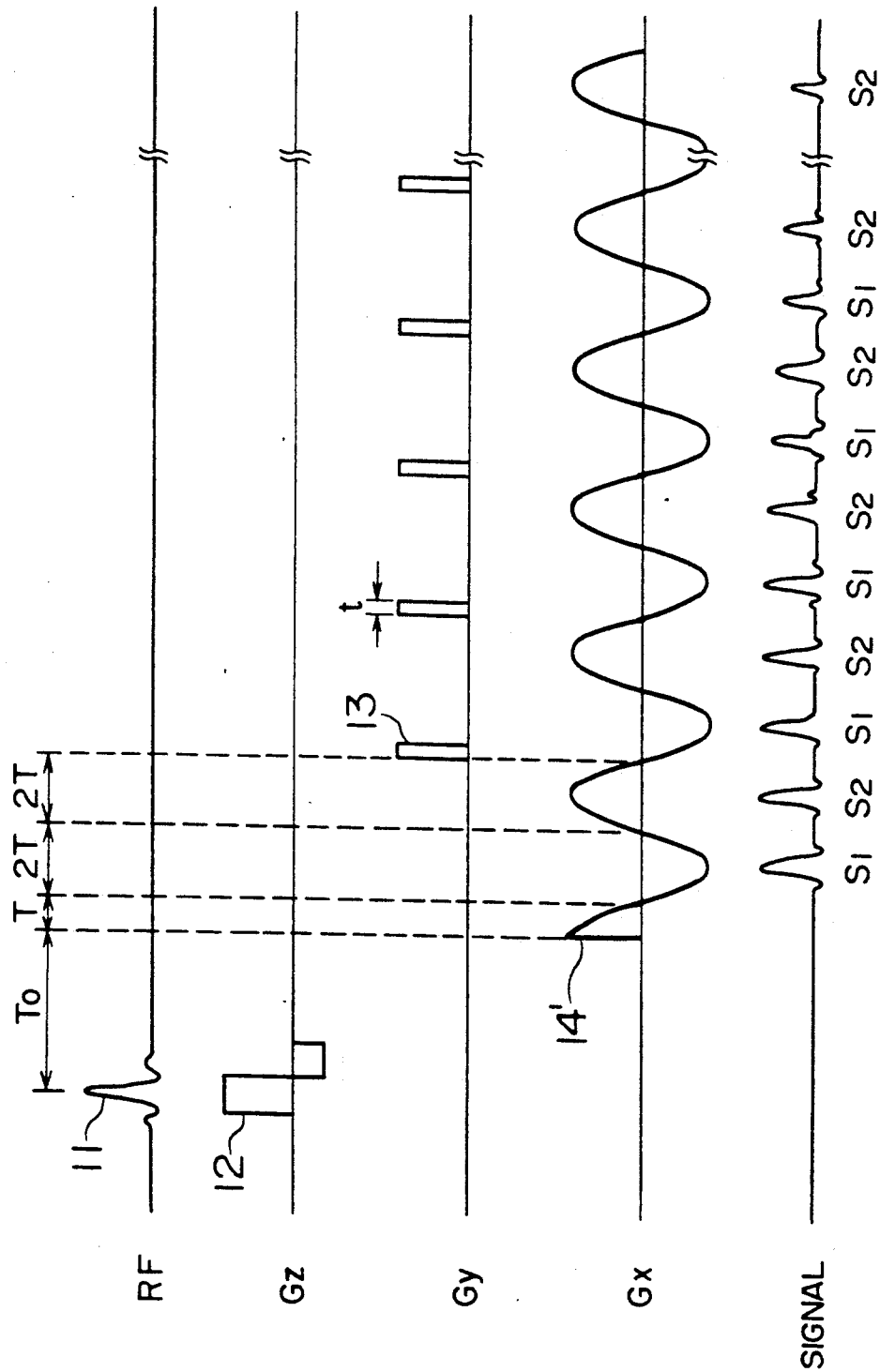
FIG. 7 is a diagram showing an example of a pulse sequence in another embodiment of the present invention.

FIG. 7 shows the pulse sequence of another embodiment of the present invention. This embodiment is different from the pulse sequence shown in FIG. 1 in that the waveform of the readout gradient magnetic field Gx which periodically inverses is not rectangular but is sinusoidal. If equal gap sampling is employed for sampling each echo, a process for correcting inequal gap data in the Fourier space becomes necessary prior to image reconstruction. The rest are exactly the same as the pulse sequence shown in FIG. 2, and the image of the blood flow portion can be acquired through the subtraction between the first image obtained from the signal train {S1} and the first image obtained from the signal train {S2}.

Figure 8:
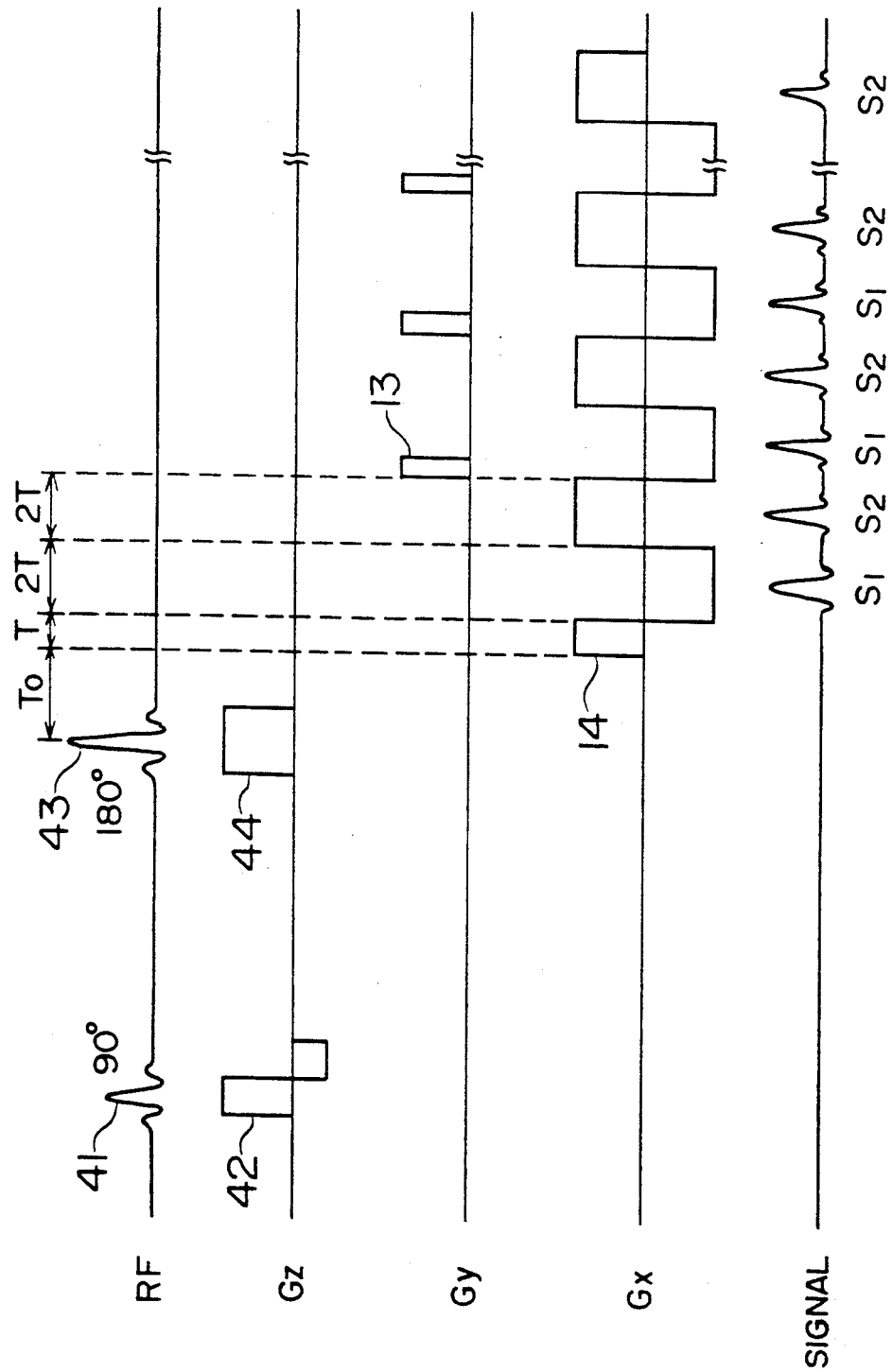
FIG. 8 is a diagram showing an example of a pulse sequence in still another embodiment of the present invention.

FIG. 8 shows the pulse sequence of still another embodiment of the present invention. The pulse sequence of this embodiment is different from the pulse sequence shown in FIG. 1 in that a 180° pulse 43 is applied between the application of the 90° pulse 41 for exciting magnetization and the application of the readout gradient magnetic field Gx inversing periodically. These RF pulses are applied in synchronism with the application of the pulses 42 and 44 of the z-direction gradient magnetic field Gz, respectively. In the sequence shown in FIG. 1, dephasing due to inhomogeneity of the static magnetic field and transverse relaxation of magnetization proceed much more with the passage of time from the 90° pulse 10. Therefore, the echoes that are generated much more belatedly are much more susceptible to them. In the sequence shown in FIG. 8, on the other hand, dephasing due to inhomogeneity of the static magnetic field gradually recovers after the application of the 180° pulse, and dephasing occurs once again after the passage of the time equal to the time interval between the 90° pulse and the 180° pulse. In consequence, the influences of inhomogeneity of the static magnetic field on the echo trains can be reduced as a whole.

Figure 9:
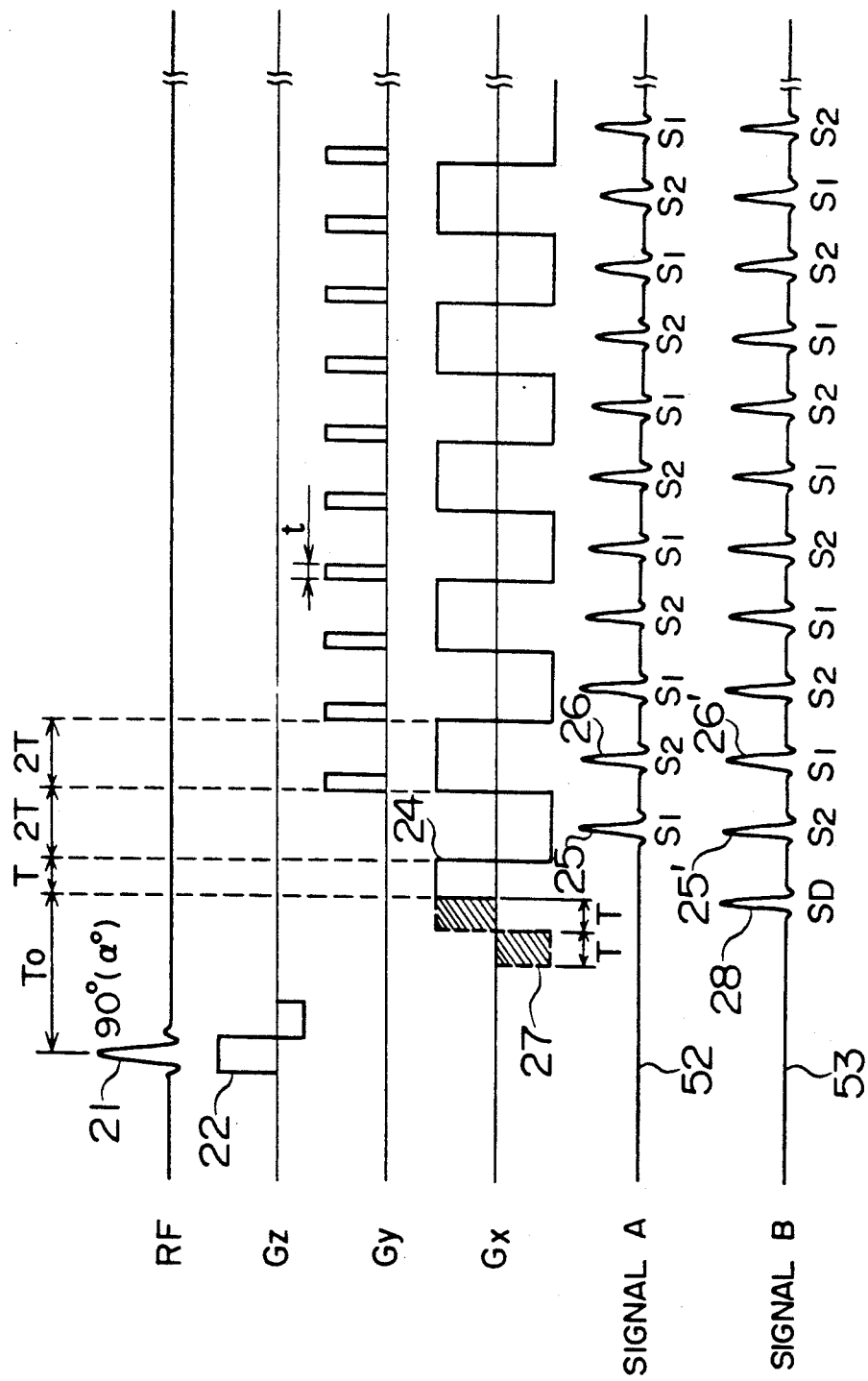
FIG. 9 is a diagram showing an example of a pulse sequence for effecting twice excitation of magnetization in still another embodiment of the present invention.

FIG. 9 shows the pulse sequence in still another embodiment of the present invention. In this embodiment, the sequence shown in the drawing is repeated twice. However, the application of the readout gradient magnetic field Gx which periodically inverses is started after the passage of the time To from the 90° pulse 21 for exciting magnetization in the first measurement, and the resulting echo train having the waveform 52 is measured. In the second measurement, the application of the readout gradient magnetic field Gx is started at the point of time which is ahead by 2T of the time after the passage of the time To from the 90° pulse 21, and the resulting echo train having the waveform 53 is measured. In other words, the second measurement uses the waveform of the gradient magnetic field, which is obtained by adding the waveform of one period represented by the hatched portion 27 to the gradient magnetic field waveform 24 used for the first measurement, and the polarity of the gradient magnetic field Gx at the start of the application is opposite between the first measurement and the second measurement. The pulse 23 of the encoding gradient magnetic field Gy is applied at the time (To+2T) in each of the first and second measurements, and is thereafter applied whenever the readout gradient magnetic field Gx inverses or in other words, in each half period 2T of the waveform of the readout gradient magnetic field.

Figure 10:
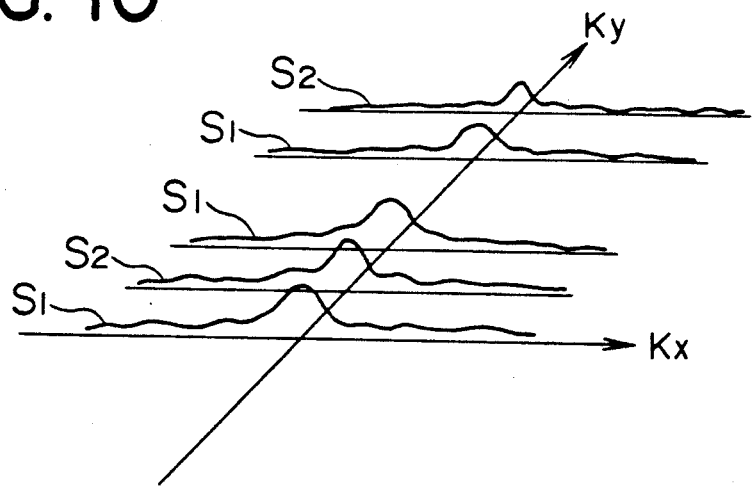
FIG. 10 is a conceptual view showing the arrangement of a first signal train in a Fourier space obtained by the first excitation of magnetization in the embodiment shown in FIG. 9.
Figure 11:
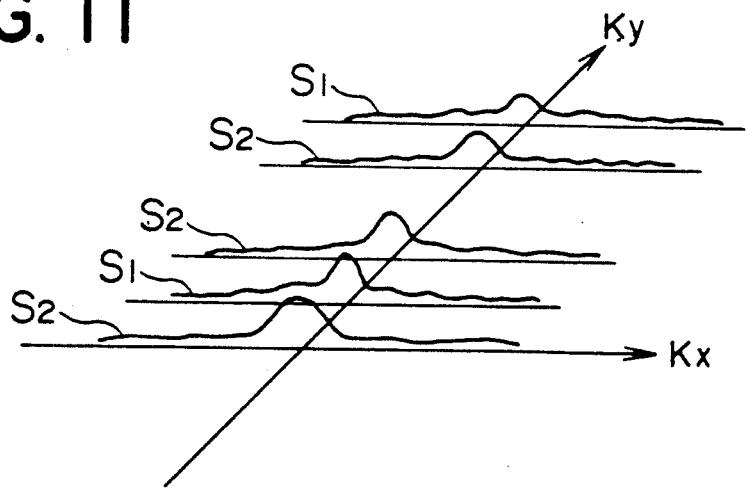
FIG. 11 is a conceptual view showing the arrangement of a second signal train in the Fourier space obtained by the second excitation of magnetization in the embodiment shown in FIG. 9.

In the first measurement within the sequence such as described above, the echo S1 whose phase change due to the velocity component is emphasized and the echo S2 whose phase change due to the velocity component is corrected occur alternately. Moreover, since the phase encoding amount increases for each echo, the arrangement of each echo in the Fourier space (kx, ky) is shown in FIG. 10. Each echo is sampled and is stored in the computer 5. On the other hand, in the second measurement, too, the echo S1 whose phase change is emphasized and the echo S2 whose phase change due to the velocity component occur alternately. However, since the first echo 28 generated from the hatched portion 27 of the readout gradient magnetic field Gx is not sampled, it is represented by symbol SD. From among the subsequent echo train, the same number of echoes as that of the echoes sampled in the first measurement are sampled and are then stored in the computer 5. However, the echo 25' having the same phase encoding amount (zero phase encoding) as that of the first echo 25 of the first measurement is the echo whose phase change due to the velocity component is corrected. Therefore, it can be represented as S2. The arrangement of these echoes in the Fourier space (kx, ky) by these two measurements is shown in FIG. 11, and the positions of arrangement of the echo S1 whose phase change due to the velocity component is emphasized and the echo S2 whose phase change due to the velocity component is corrected become mutually opposite in the second measurement.

Figure 12:
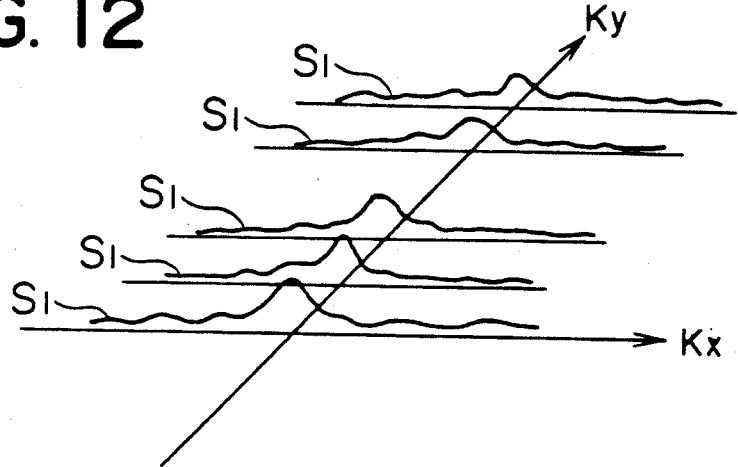
FIG. 12 is an explanatory view of the signal train {S1} obtained by replacing the first signal train and the second signal train in the embodiment shown in FIG. 9.
Figure 13:
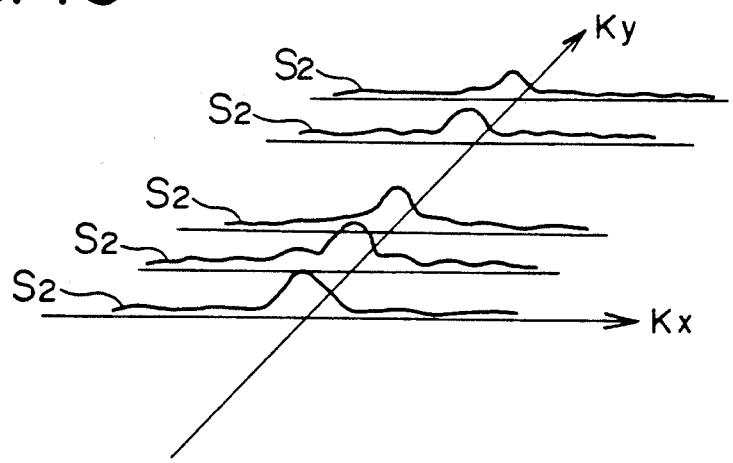
FIG. 13 is an explanatory view of the signal train {S2} obtained by replacing the first signal train and the second signal train in the embodiment shown in FIG. 9.

Next, the computer 5 mutually replaces the data of the two data trains obtained by these two signal measurements and acquires the data train {S1} in which only the echoes S1 whose phase change due to the velocity component is emphasized are aligned and the data train {S2} in which only the echoes S2 whose phase change due to the velocity component is corrected are aligned. The data train {S1} is illustrated as in FIG. 12 in the Fourier space and the data train {S2} is illustrated as in FIG. 13 in the Fourier space. Since the two data trains are thus obtained in exactly the same way as in the embodiment shown in FIG. 1, each of these data trains is subjected to two-dimensional Fourier transform and the first and second images are reconstructed. Thereafter, the image of only the blood flow portion such as shown in FIG. 6 is obtained by executing their subtraction processing.

When the method which dividedly measures the echo trains in accordance with excitation of magnetization which is made twice, as in this embodiment, the number of echoes measured each time to obtain the blood flow image having the same resolution can be reduced to the half of the first embodiment shown in FIG. 1. Since inhomogeneity of the static magnetic field and the influences of the transverse relaxation of the magnetization gradually accumulate after the excitation of magnetization, the number of echoes that can be measured is limited. Accordingly, if the greatest possible number of echoes are measured each time; this embodiment can acquire the blood flow image having resolution twice that of the embodiment shown in FIG. 1. Particularly, in this embodiment, the echoes having the same phase encoding quantity (such as the echoes 25 and 25' or 26 and 26' in FIG. 9) appear at the point of time having the same time of passage from the excitation of magnetization in the first and second measurements. For this reason, the influences of the inhomogeneity of the static magnetic field or the transverse relaxation of magnetization on the reconstructed first and second images are equal. Accordingly, the artifact resulting from the influences of the inhomogeneity of the static magnetic field or the transverse relaxation of magnetization does not appear in the final image obtained by the subtraction processing of both of these images. On the other hand, the measuring time is shorter in the embodiment shown in FIG. 1. Therefore, the embodiment is superior in order to avoid the occurrence of the artifact resulting from the motion of the subject.

Figure 14:
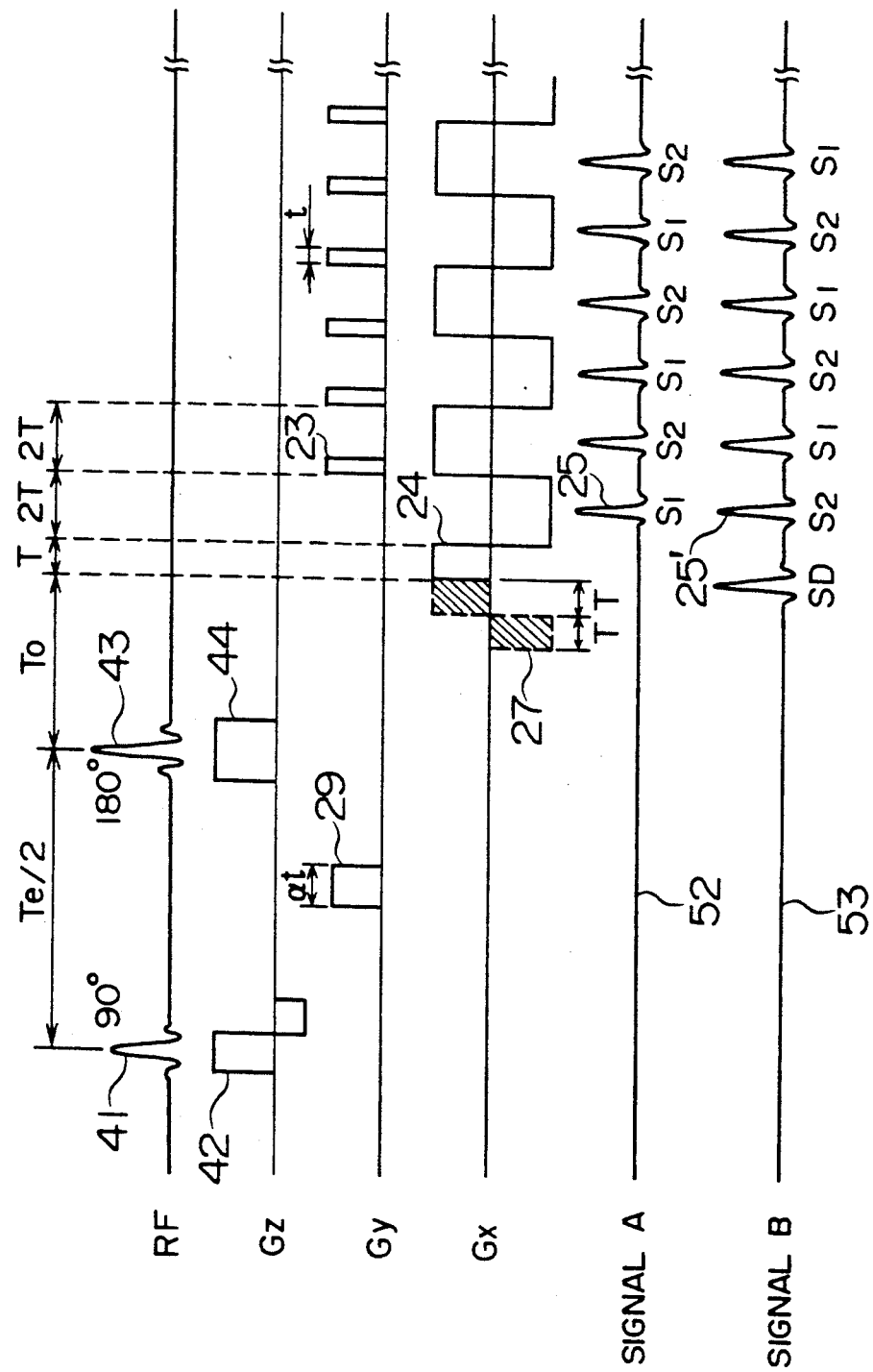
FIG. 14 is a diagram showing an example of a pulse sequence in still another embodiment of the present invention which diverts an improved half encode method.

FIG. 14 shows the pulse sequence in still another embodiment of the present invention. In this embodiment, too, the measurements of the echoes are carried out devidedly in accordance with the excitation which is made twice, in the same way as in the embodiment shown in FIG. 9. Excitation of magnetization is made each time by applying the z-direction gradient magnetic field Gz represented by reference numeral 42 and the 90° pulse 41 and furthermore, the direction of magnetization inside the region of interest excited by the application of the z-direction gradient magnetic field Gz represented by reference numeral 44 and the 180° pulse 43 is inversed. The application of the readout gradient magnetic field Gx, which periodically inverses, is started at the point of time after the passage of the time To from the 180° pulse 43 in the first measurement, and the readout gradient magnetic field waveform, to which the hatched portion 27 is further added, is used in the second measurement. In this way, the echo train represented by the waveform 52 is generated in the first measurement while the echo train represented by the waveform 53 is generated in the second measurement. Whenever the readout gradient magnetic field Gx inverses, the pulse 23 having the width t of the encoding gradient magnetic field Gy is applied in the same way as in the embodiment shown in FIG. 9. Furthermore, a pulse 29 of the gradient magnetic field Gy having a pulse width $\alpha t$ (where $\alpha$ is an integer) is applied prior to the 180° pulse 43. In this manner, the phase encoding quantity of the echo that occurs after the pulse 23 is applied $\alpha$ times becomes zero. The number of encoding step by the application of the pulse 23 is $(\alpha+n)$. Therefore, $(\alpha+n+1)$ echoes are sampled in both of the first and second measurements, with the proviso that $\alpha<n$. Accordingly, the gradient-time product $\alpha$Gyt of the pulse 29 is smaller than $\frac{1}{2}$ of the sum of the gradient-time products of the pulse 23, i.e. $(\alpha+n)$Gyt.

Figure 15:
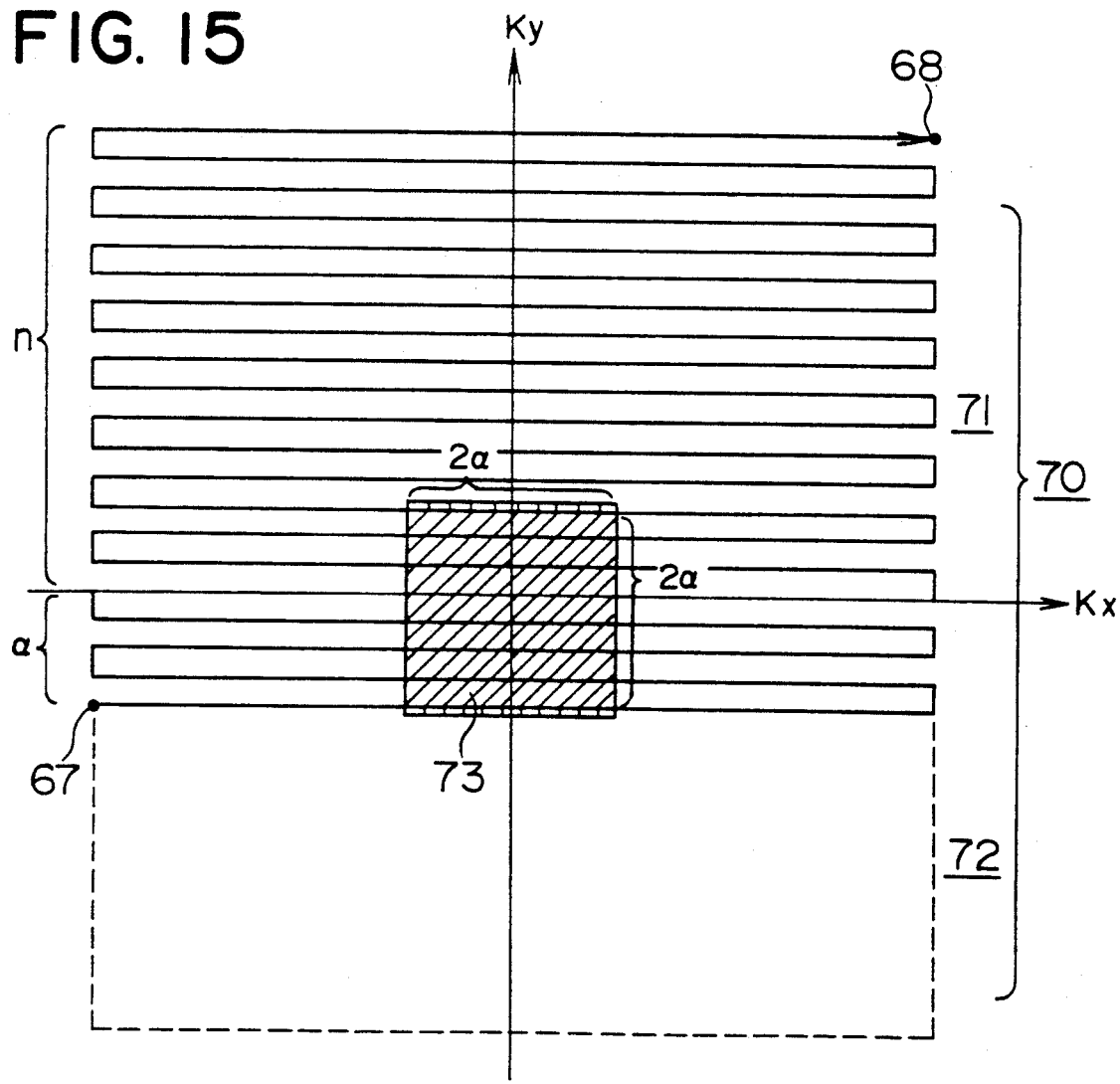
FIG. 15 is a data mapping diagram on the Fourier space showing the sequence of data sampling in the embodiment shown in FIG. 14.

A trajectory of the sample data on the Fourier space in each of these two measurements by such a sequence is shown in FIG. 15. The phase encoding quantity of the echo which is first sampled by the application of the gradient magnetic field Gy (the echo 25 or 25' in FIG. 14) is $-\alpha$Gyt. Therefore, sampling is started from the point 67 in FIG. 15 on the Fourier space. Since the phase encoding amount increases by Gyt whenever the pulse 23 is applied, the sampling point sequentially moves in the ky direction of the Fourier space (kx, ky), and sampling of the last echo is completed at the point 68 in the drawing. In this way, sampling is effected in a vertically asymmetric region with respect to the kx axis. The data replacement described in detail in the embodiment shown in FIG. 9 is effected to obtain the data train {S1} in only the data of the echoes S1 are aligned and the data train {S2} in which only the data of the echoes S2 are aligned. Then, reconstruction of each image is made. In this embodiment, the following image reconstruction processing s executed in order to avoid any error resulting from data extension by the half Fourier method.

First of all, a data region of 2n x 2n data represented by reference numeral 70 in FIG. 15 is set, and the data train {S1} obtained by the replacement operation described above is put into a region 71 from which the measurement data are obtained. The value of each sampling point in an unmeasured region 72 is set to zero. This data row is then subjected to two-dimensional Fourier transform, and the image data thus obtained is set to M'(x, y). Separately, each data of the data train {S1} described above is put into only the region 73 having $2\alpha \times 2\alpha$ sampling points and having substantially the origin of the Fourier space as its center while the values of the other sampling points of the region 70 are set to zero. Under this state, two-dimensional Fourier transform is carried out and the resulting image data is set to M''(x, y). Since this image data M''(x, y) is obtained from the data of the region which is close to the origin of the Fourier space, it exhibits a magnetization distribution image having low resolution. The phase of the signal of each pixel is determined from the imaginary and real parts of each point of this image data M''(x, y) to obtain a phase map $\theta(x, y)$. Next, the phase of the image data M'(x, y) is corrected in accordance with the following formula:

$$Mcom(x, y) = M'(x, y) \cdot exp\{j2\theta(x, y)\} \quad (5)$$

The corrected image data is subjected to the inverse two-dimensional Fourier transform to return is to the data of the Fourier space. Next, among the data region 70, the region 71 from which the measurement data are obtained is set to the previous data train {S1}, and the estimation data $F^{-1}[Mcom(x, y)]$ obtained by the inverse two-dimensional Fourier transform described above is applied to the unmeasured region 72. Data extension from the region 71 to the whole region 70 is thus completed by the procedures described above. Incidentally, data processing by such an improved half Fourier method is described in detail in U.S. Pat. No. 4,912,412. Two-dimensional Fourier transform is made for this extended data to obtain the image M(x, y). Such an image reconstruction processing is executed for both of the data trains {S1} and {S2}, and the intended flow image can be obtained by effecting subtraction between both of the images.

In order to extend the data region by obtaining the phase map θ(x, y) having reduced errors in this embodiment, it is preferred to reduce as much as possible any influences of inhomogeneity of the static magnetic field on the data of the center region 73. To this end, the point of time at which the same time as the time difference Te/2 between the 90° pulse 41 and the 180° pulse 43 in FIG. 14 has elapsed from the application of the 180° pulse 43, that is, the point of time at which the magnetization which is dephased by the inhomogeneity of the static magnetic field rephases, should exist at least within the period of generation of the echo train from the echo 25 or 25' providing the data of the center region 73 to the 2αth echo. Most preferably, the time difference of the peaks between the 180° pulses 43 and the echo whose phase encoding amount is zero among their echoes is made equal to Te/2, as expressed by the following formula:

$$T_0 + 2(\alpha + 1)T = Te/2 \qquad (6)$$

According to the embodiment employing the improved half Fourier method and explained with reference to FIGS. 14 and 15, the number of echoes sampled becomes somewhat greater than the number of echoes in the ordinary half Fourier method and the measurement time becomes somewhat longer, as well. However, since the data extension can be correctly made by the phase correction in the image space, an image having higher image quality can be obtained. The best effect can be obtained particularly by setting the peak position of the echo having the zero phase encoding amount expressed by the formula (6).

On the other hand, when this improved half Fourier method is applied to the echo train formation sequence not using the 180° pulse as in the embodiment shown in FIG. 1 or 9, it is preferred to employ the encoding sequence, which allows the echoes in the center region to first appear and which has been explained with reference to FIG. 14, in order to reduce the influences of the inhomogeneity of the static magnetic field and the transverse relaxation on the data of the center region 73. This can be accomplished, for example, by setting the gradient-time product of the pulse 10 of the gradient magnetic field Gy having the opposite polarity and represented by dash line in FIG. 1 to $-\alpha$Gyt, and setting a valve of the αGyt below ½ of the sum of the gradient-time product $(\alpha + n)$Gyt of the pulse 13 of the gradient magnetic field Gy repeatedly applied.

The fluid imaging method of the various embodiments given above is the method which acquires all the necessary data by the excitation of magnetization with a reduced number of times, and can remarkably reduce the measurement time in comparison with the conventional fluid imaging methods. It is of course possible to combine the concept of these embodiments or to change or modify the embodiments without departing from the scope thereof. In order to cope with attenuation of the echo signals due to the transverse relaxation, for example, the echo train which is measured after one excitation of magnetization in each of the embodiments may as well be divided into a plurality of groups so that excitation of magnetization can be made for generating the echo train of each of these groups. Even when such a modified measurement sequence is employed, the effect of obtaining the fluid image in a short measurement time by a reduced number of times of excitation of magnetization is not at all lost by employing an appropriate number of groups.

We claim:

1. A fluid imaging method using an MRI apparatus comprising the steps of:

exciting magnetization of a predetermined region of interest of a subject placed in a space to which a static magnetic field is applied;

applying a gradient magnetic field for grading said static magnetic field along a first direction of said space, said gradient magnetic field having polarities of gradient thereof periodically inversing, so as to alternately generate echo signals whose phase change of magnetization due to a flow is emphasized and echo signals whose phase change of magnetization due to a flow is corrected;

applying repeatedly a gradient magnetic field in the form of a pulse for grading said static magnetic field along a second direction crossing orthogonally said first direction in association with a waveform of said gradient magnetic field inversing periodically, so as to thereby apply sequentially phase encoding to a resulting echo train;

sampling each echo signal of said echo train generated by the application of said inversing gradient magnetic field and said pulse-like gradient magnetic field so as to form a first data train gathering only data of echo signals whose phase change of magnetization due to the flow is emphasized and a second data train gathering only echo signals whose phase change of magnetization due to the flow is corrected;

obtaining individually first and second images having positions thereof decomposed in said first and second directions from said first and second data trains, respectively; and obtaining a flow image emphasizing only an inside flow of said region of interest by executing subtraction processing between said first and second images.

2. A fluid imaging method using an MRI apparatus according to claim 1, wherein said pulse-like gradient magnetic field is applied in each cycle of the waveform of said gradient magnetic field inversing periodically, so that a phase encoding amount changes for each pair of the echo signals whose phase change of magnetization due to the flow is emphasized and the echo signal whose phase change of magnetization due to the flow is corrected.

3. A fluid imaging method using an MRI apparatus according to claim 1, which further includes the step of:

inversing the direction of magnetization excited during the period between the excitation of magnetization and the application of said gradient magnetic field inversing periodically.

4. A fluid imaging method using an MRI apparatus comprising the processes of:

a first excitation process for exciting magnetization of a predetermined region of interest of a subject placed in a space to which a static magnetic field is applied;

a generation process of a first echo train continuing said first excitation process, including the application of a first gradient magnetic field for grading said static magnetic field along a first direction of said space, said first gradient magnetic field having polarities thereof inversing periodically, and the application of a second gradient magnetic field in the form of a plurality of pulses along a second direction crossing orthogonally said first direction, so as to alternately generate echo signals whose phase change of magnetization due to a flow is emphasized and echo signals whose phase change of magnetization due to the flow is corrected;

a second excitation process for exciting once again the magnetization of said region of interest;

a generation process of a second echo train continuing said second excitation process, including the application of said first gradient magnetic field and the application of said second gradient magnetic field, so as to alternately generate once again the echo signals whose phase change of magnetization due to the flow is emphasized and the echo signals whose change of magnetization due to the flow is corrected;

a replacement process of data trains for individually forming a first data train gathering only data of the echo signals whose phase change of magnetization due to the flow is emphasized and a second data train gathering only data of the echo signals whose phase change of magnetization due to the flow is corrected, by sampling each of the echo signals during said generation process of said first and second echo trains;

a process for obtaining individually first and second images whose positions are decomposed in said first and second directions from said first and second data trains, respectively; and a process for obtaining a flow image emphasizing only an inside flow of said region of interest by executing a subtraction processing between said first and second images.

5. A fluid imaging method using an MRI apparatus according to claim 4, wherein said second gradient magnetic field is applied whenever the polarity of said second gradient magnetic field inverses during said generation process of said first echo train and during said generation process of said second echo train.

6. A fluid imaging method using an MRI apparatus according to claim 4, wherein the number of echoes generated in said generation process of said first echo train is equal to that in said generation process of said second echo train.

7. A fluid imaging method using an MRI apparatus according to claim 4, wherein the inversion period of said first gradient magnetic field in said generation process of said first echo train is equal to that in said generation process of said second echo train.

8. A fluid imaging method using an MRI apparatus according to claim 4, wherein an application start timing of said first gradient magnetic field in said generation process of said first echo train using said first excitation process as the origin of time and an application start timing of said first gradient magnetic field in said generation process of said second echo train using said second excitation process as the origin of time have a time difference corresponding to one cycle of the waveform of said first gradient magnetic field.

9. A fluid imaging method using an MRI apparatus according to claim 4, wherein the echo signal whose phase change of magnetization due to the flow is emphasized in said first echo train and the echo signal whose phase change of magnetization due to the flow is corrected in said second echo train are echo signals having mutually the same phase encoding amount, and are generated when an equal time has elasped from the respective magnetization excitation processes, and similarly, the echo signal whose phase change of magnetization due to the flow is corrected in said first echo train and the echo signal whose phase change of magnetization due to the flow is emphasized in said second echo train are echo signals having mutually the same phase encoding amount, and are generated when an equal time has elapsed from the respective magnetization excitation process.

10. A fluid imaging method using an MRI apparatus according to claim 4, which further includes a process for inversing the direction of magnetization excited during the period form said first magnetization excitation process to said generation process of said first echo train and during the period from said second magnetization excitation process and said generation process of said second echo train.

11. An imaging method using an MRI apparatus comprising the steps of:

exciting magnetization of a predetermined region of interest of a subject placed in a space to which a static magnetic field is applied;

applying a gradient magnetic field in a first direction for grading said static magnetic field along said first direction of said space, said gradient magnetic field having polarities of gradient thereof periodically inversing, so as to generate an echo train containing a plurality of echoes;

applying a gradient magnetic field in a second direction crossing orthogonally said first direction while dividing it into first pulses during a period from the excitation of magnetization to the application of said first direction gradient magnetic field and second pulses during a period overlapping with an application timing of said first direction gradient magnetic field, whereby said first and second pulses have mutually opposite polarities;

reconstructing a first image of an image space from data train obtained by sampling each echo signal of said echo trains;

reconstructing a second image of the image space from two-dimensional data of a partial data region having substantially the origin of a Fourier space as its center among said data train;

correcting the phase of said first image by the use of the phase distribution of said second image;

obtaining estimation data of the Fourier space by effecting inverse Fourier transform of the corrected image of the image space;

obtaining an extended data train by combining said data train of each echo signal and said estimation data obtained by inverse Fourier transform; and obtaining an intended image by effecting Fourier transform of said extended data train.

12. An imaging method using an MRI apparatus according to claim 11, wherein the gradient-time product of said first pulse is smaller than a half of the sum of the gradient-time products of said second pulses.

13. An imaging method using an MRI apparatus comprising the steps of:

exciting magnetization of a predetermined region of interest of a subject placed in a space to which a static magnetic field is applied;

inversing the direction of said excited magnetization;

applying a gradient magnetic field in a first direction for grading said static magnetic field in said first direction of said space, said gradient magnetic field having the polarities of gradient thereof inversing periodically, so as to generate an echo train containing a plurality of echoes;

applying a gradient magnetic field in a second direction crossing orthogonally said first direction while dividing it into first pulses during the excitation of said magnetization and during an inversion of the direction of said magnetization and a plurality of second pulses during a period overlapping with an application of said first direction gradient magnetic field;

reconstructing a first image of an image space from the data train obtained by sampling each echo signal of said echo trains;

reconstructing a second image of the image space from two-dimensional data of a partial data region having substantially the origin of a Fourier space as its center among said data train;

correcting the phase of said first image by the use of the phase distribution of said second image;

obtaining estimation data of the Fourier space by effecting inverse Fourier transform of said phase-corrected image of said image space;

obtaining an extended data train by combining said data train of each echo signal and said estimation data obtained by an inverse Fourier transform; and obtaining an intended image by effecting Fourier transform of said extended data train.

14. An imaging method using an MRI apparatus according to claim 13, wherein the gradient-time product of said first pulse is smaller than a half of the sum of the gradient-time products of said second pulses.

15. An imaging method using an MRI apparatus according to claim 12, wherein the point of time at which the time equal to the time difference between a point of excitation of said magnetization and a point of an inversion of the direction of said magnetization has elapsed from a point of an inversion of the direction of said magnetization is within a generation period of the echoes providing data of said partial data region among said echo train.

16. An imaging method using an MRI apparatus according to claim 12, wherein the time difference between the point of the inversion of the direction of said magnetization and the point of a peak of the echo whose phase encoding amount due to said second direction gradient magnetic field among said echo train is equal to a time difference between the point of the excitation of said magnetization and the point of the inversion of the direction of said magnetization.

* * * * *